United States Patent
Reith et al.

(10) Patent No.: US 12,211,956 B2
(45) Date of Patent: Jan. 28, 2025

(54) RADIATION-EMITTING COMPONENT AND METHOD FOR PRODUCING A RADIATION-EMITTING COMPONENT

(71) Applicant: OSRAM OLED GmbH, Regensburg (DE)

(72) Inventors: Andreas Reith, Steinach (DE); Rainer Bradl, Regensburg (DE); Ulrich Streppel, Regensburg (DE); Thomas Birke, Wenzenbach (DE)

(73) Assignee: OSRAM OLED GMBH, Regensburg (DE)

( * ) Notice: Subject to any disclaimer, the term of this patent is extended or adjusted under 35 U.S.C. 154(b) by 151 days.

(21) Appl. No.: 17/254,129

(22) PCT Filed: Jun. 27, 2019

(86) PCT No.: PCT/EP2019/067190
§ 371 (c)(1),
(2) Date: Dec. 18, 2020

(87) PCT Pub. No.: WO2020/007710
PCT Pub. Date: Jan. 9, 2020

(65) Prior Publication Data
US 2021/0273139 A1    Sep. 2, 2021

(30) Foreign Application Priority Data
Jul. 5, 2018   (DE) .................. 10 2018 116 327.4

(51) Int. Cl.
*H01L 33/48*   (2010.01)
*H01L 33/00*   (2010.01)
*H01L 33/40*   (2010.01)

(52) U.S. Cl.
CPC ........ *H01L 33/405* (2013.01); *H01L 33/0095* (2013.01); *H01L 33/483* (2013.01)

(58) Field of Classification Search
CPC .......... H01L 2933/005; H01L 33/0095; H01L 33/405; H01L 33/46; H01L 33/483; H01L 33/54
See application file for complete search history.

(56) References Cited

U.S. PATENT DOCUMENTS 6,392,294 B1    5/2002  Yamaguchi
2006/0006400 A1*  1/2006  Yoo .................. H01L 33/06
                                            257/E33.068
(Continued)

FOREIGN PATENT DOCUMENTS

DE    102015121074 A1    6/2017
EP       1854831 A1     11/2007
(Continued)

OTHER PUBLICATIONS

International Search Report for PCT/EP2019/067190 mailed Sep. 10, 2019.

*Primary Examiner* — Matthew C Landau
*Assistant Examiner* — Dmitriy Yemelyanov
(74) *Attorney, Agent, or Firm* — ArentFox Schiff LLP

(57) ABSTRACT

A radiation-emitting component is specified with—a carrier which has a top surface a radiation-emitting semiconductor chip arranged on the top surface of the carrier and configured to generate primary electromagnetic radiation, a first reflector layer arranged above a top surface of the semiconductor chip, and a cover body arranged between the first reflector layer and the radiation-emitting semiconductor chip, wherein a side surface of the cover body is inclined to the top surface of the carrier. Furthermore, a method for producing such a radiation-emitting component is specified.

6 Claims, 2 Drawing Sheets

(56) References Cited

U.S. PATENT DOCUMENTS

Figure 1:
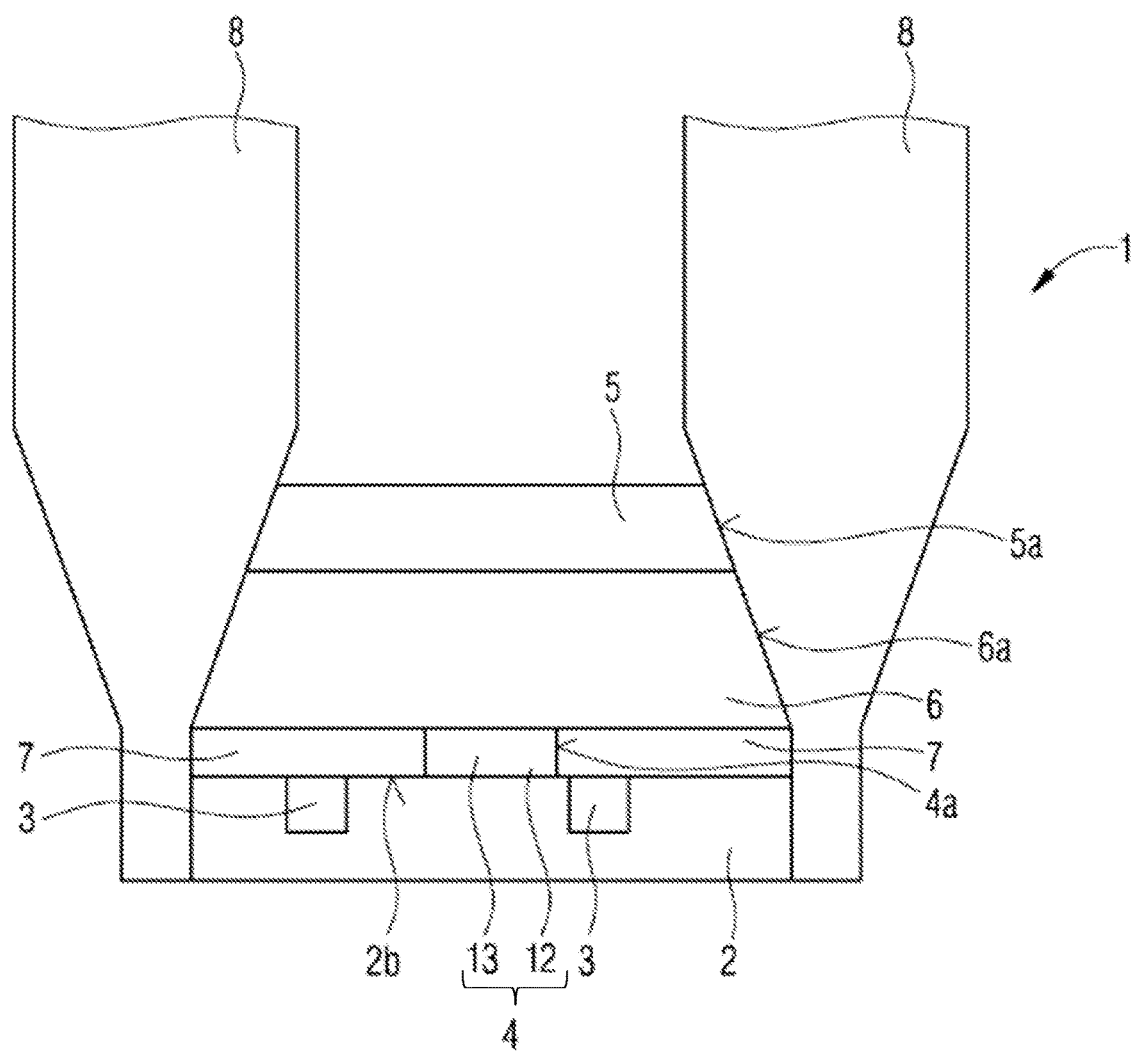

| | | | |
|---|---|---|---|
| 2008/0308824 A1 | 12/2008 | Shchekin et al. | |
| 2008/0315228 A1 | 12/2008 | Krames et al. | |
| 2009/0057702 A1 | 3/2009 | Chiu | |
| 2009/0261725 A1 | 10/2009 | Chang | |
| 2010/0289039 A1 | 11/2010 | Van Gorkom et al. | |
| 2012/0012856 A1* | 1/2012 | Chen | H01L 33/22 |
| | | | 438/46 |
| 2012/0319149 A1* | 12/2012 | Su | H01L 33/20 |
| | | | 257/E33.056 |
| 2013/0313594 A1 | 11/2013 | Han et al. | |
| 2015/0049510 A1 | 2/2015 | Haiberger et al. | |
| 2015/0340580 A1 | 11/2015 | Oh et al. | |
| 2016/0240746 A1* | 8/2016 | Yun | H01L 33/56 |
| 2018/0175265 A1* | 6/2018 | Kim | H01L 27/15 |
| 2019/0157521 A1* | 5/2019 | Harada | H01L 33/507 |

FOREIGN PATENT DOCUMENTS

| | | |
|---|---|---|
| EP | 2212930 B1 | 2/2018 |
| WO | 2009/066207 A1 | 5/2009 |
| WO | 2013/135696 A1 | 9/2013 |
| WO | WO-2017093248 A1 * | 6/2017 |

* cited by examiner

RADIATION-EMITTING COMPONENT AND METHOD FOR PRODUCING A RADIATION-EMITTING COMPONENT

This application is a 35 U.S.C. § 371 National Phase of PCT Application No. PCT/EP2019/067190, filed Jun. 27, 2019, which claims priority to German Application No. 10 2018 116 327.4, filed Jul. 5, 2018, the disclosures of which are hereby incorporated by reference herein in their entireties.

A radiation-emitting component is specified. In addition, a method for producing a radiation-emitting component is specified.

One object to be solved is to specify a radiation-emitting component with a particularly efficient radiation characteristic. A further object to be solved is to specify a method for producing such a radiation-emitting component.

A radiation-emitting component is specified. The radiation-emitting component is preferably a component that emits electromagnetic radiation, in particular visible light, during operation. For example, the radiation-emitting component is a light-emitting diode.

The radiation-emitting component has a main plane of extension. The lateral directions are aligned parallel to the main plane of extension and the vertical direction is perpendicular to the main plane of extension.

According to at least one embodiment, the radiation-emitting component comprises a carrier having a top surface. The top surface preferably extends in lateral directions and is arranged opposite a bottom surface and spaced apart from it in the vertical direction.

The carrier contains or consists of a plastic material, for example an epoxy or a silicone, or a ceramic material.

Preferably, the carrier has at least two contact areas on the top surface. The at least two contact areas are, for example, incorporated into the top surface of the carrier. For example, the contact areas only partially penetrate the carrier so that the contact areas are flush with the top surface. Furthermore, the contact areas can penetrate the carrier completely so that the contact areas are flush with the top surface and the bottom surface of the carrier. The contact areas comprise or consist of a metal, for example. The metal is, for example, silver or copper.

According to at least one embodiment, the radiation-emitting component comprises a radiation-emitting semiconductor chip arranged on the top surface of the carrier and configured to generate primary electromagnetic radiation. The radiation-emitting semiconductor can be a volume emitter, for example.

For example, a volume emitting, radiation-emitting semiconductor chip has a substrate on which a semiconductor body is epitaxially grown or applied. The substrate can, for example, have one of the following materials or consist of one of the following materials: sapphire, silicon carbide, glass. Volume-emitting, radiation-emitting semiconductor chips emit the generated radiation not only via a single light-emitting surface but also via a side surface. In the case of volume emitters, for example, at least 30% of the emitted radiation passes through the side surface. Preferably, the radiation-emitting semiconductor chip is a light-emitting diode chip.

The semiconductor body of the radiation-emitting semiconductor chip is configured to generate the primary electromagnetic radiation. The semiconductor body is for example an epitaxially grown semiconductor body. The semiconductor body can be based on a III-V compound semiconductor material. The semiconductor body comprises an active region which can include a quantum well structure or a multiple quantum well structure. The active region is configured to generate the primary electromagnetic radiation.

The radiation-emitting semiconductor chip preferably comprises a bottom surface extending in lateral directions which is opposite a top surface of the radiation-emitting semiconductor chip and which are connected by a side surface.

The radiation-emitting semiconductor chip is preferably electrically conductively connected to the at least two contact areas. For example, the bottom surface of the semiconductor chip is connected to one of the at least two contact areas. Furthermore, for example, the top surface of the semiconductor chip is electrically conductively connected to the other of the two contact areas by means of a wire connection.

Alternatively, it is possible that the radiation-emitting semiconductor chip is a flip chip, for example. This preferably has two chip contact areas. Each of the chip contact areas on the bottom surface of the semiconductor chip is preferably arranged on one contact area. Each chip contact area is preferably electrically connected to a contact area.

According to at least one embodiment, the radiation-emitting component comprises a first reflector layer arranged above a top surface of the semiconductor chip. The first reflector layer preferably completely covers the top surface of the radiation-emitting semiconductor chip in plan view. In addition, the first reflector layer can project beyond the radiation-emitting semiconductor chip in lateral directions, for example. The first reflector layer preferably comprises a bottom surface extending in lateral directions, which is opposite a top surface and which are connected to one another by a side surface. In addition, the bottom surface of the first reflector layer preferably faces the top surface of the radiation-emitting semiconductor chip.

The first reflector layer is preferably configured to reflect the primary electromagnetic radiation emitted during operation of the radiation-emitting semiconductor chip. The primary radiation, which is emitted from the top surface of the radiation-emitting semiconductor chip during operation, for example, can be reflected in lateral directions.

The first reflector layer can, for example, be formed by a plastic or silicone filled with radiation scattering and/or radiation reflecting particles. The particles of the first reflector layer are for example titanium oxide particles.

Alternatively, it is possible that the first reflector layer is configured only partially reflective and a small portion of the primary electromagnetic radiation emitted by the semiconductor chip, for example, at most 15%, passes through the first reflector layer.

According to at least one embodiment, the radiation-emitting semiconductor chip comprises a cover body arranged between the first reflector layer and the radiation-emitting semiconductor chip. The cover body preferably has a top surface opposite a bottom surface, which is connected by a side surface. The top surface is in direct and immediate contact with the first reflector layer, for example. Furthermore, the bottom surface is preferably in direct and immediate contact with the top surface of the radiation-emitting semiconductor chip. Alternatively, it is possible that the side surface of the radiation-emitting semiconductor chip is also covered by the cover body and is in direct and immediate contact with it.

In plan view, the cover body preferably covers the top surface of the radiation-emitting semiconductor chip completely. In addition, the cover body can, for example, project beyond the radiation-emitting semiconductor chip in lateral directions. Furthermore, the first reflector layer preferably completely covers the top surface of the cover body in plan view and preferably does not protrude beyond it in lateral directions.

According to at least one embodiment, a side surface of the cover body is inclined to the top surface of the carrier. The top surface of the carrier and the side surface of the cover body facing the carrier preferably form an angle of less than 90°. The preferred angle is 45°, particularly preferably 60°.

A cross-sectional area of the cover body in lateral directions at the level of the top surface of the semiconductor chip is larger than a cross-sectional area of the cover body in lateral directions at the level of the bottom surface of the first reflector. This means that the cross-sectional area of the cover body in lateral directions tapers from the semiconductor chip to the first reflector layer.

In at least one embodiment, the radiation-emitting component comprises a carrier having a top surface, a radiation-emitting semiconductor chip arranged on the top surface of the carrier and configured to generate primary electromagnetic radiation, a first reflector layer arranged over a top surface of the semiconductor chip, and an cover body arranged between the first reflector layer and the radiation-emitting semiconductor chip, a side surface of the cover body is inclined to the top surface of the carrier.

An idea of the radiation-emitting component described here is, inter alia, that the cover body, which is arranged between the first reflector layer and the radiation-emitting semiconductor chip, is formed inclined. Due to the inclined side surface of the cover body, a main direction of the Lambertian radiation is tilted towards a normal of the side surface. Advantageously, a half space above the radiation-emitting component can be better illuminated. This has the advantage of improving a colour homogeneity.

Furthermore, a comparatively small number of components is required to illuminate, for example, an LCD filter system. By radiating into the half space above the component, a particularly small distance to the LCD filter system can be achieved. The radiation efficiency is thus comparatively high, since comparatively fewer absorption losses occur in the half-space lying below the component.

An optical separation of the components by means of reflecting grid structures, for example, is not necessary due to the inclined side surfaces and is therefore advantageously cost-effective.

According to at least one embodiment, the side surface of the cover body is flat. "Flat" means here that the side surface has essentially no elevations or depressions. Essentially means here that the side surface can have slight elevations or depressions resulting from the production process. For example, the side surface can have traces of a saw blade or a laser process.

The side surface of the cover body extending flat has a virtual normal that is perpendicular to the side surface. Electromagnetic radiation, comprising primary radiation and, if necessary, secondary radiation, is coupled out of the radiation-emitting component through the side surface of the cover body. By means of the flat side surface of the cover body, the electromagnetic radiation can advantageously be coupled out uniformly in the direction of the normal facing away from the cover body.

According to at least one embodiment, the side surface of the cover body is curved. For example, the side surface can have a convex or concave shape. Furthermore, the side surface can have a spherical, aspherical or free form. Advantageously, the coupled out electromagnetic radiation can thus be bundled or expanded.

According to at least one embodiment, the side surface of the cover body, which is inclined to the top surface of the carrier, has a plurality of sections. The sections are formed by a part of the side surface of the cover body. Furthermore, a section can be formed by the side surface of the first reflector layer. Preferably, the side surface of the cover body is divided into the plurality of sections in the vertical direction. The sections have end regions at which the directly adjacent sections are in direct contact. The end regions of each section are preferably at the same height in the vertical direction.

According to at least one embodiment, the section each are flat and are tilted with respect to one another. The end region of a first section, which is in a region of the semiconductor chip in the vertical direction, and the end region of a last section, which is in a region of the first reflector layer in the vertical direction, can span a virtual plane which is inclined to the top surface of the carrier. The top surface of the carrier and the virtual plane facing the carrier preferably enclose an angle smaller than 90°. The preferred angle is 45°, particularly preferably 60°.

The virtual plane can also be curved. The virtual plane has the same properties as the curved side surface of the cover body described above. The sections extend along the virtual plane and are each tilted to the virtual plane and with respect to one another.

Each of the sections has a normal, each being perpendicular to the sections. The electromagnetic radiation is then coupled out through the sections in the direction of the respective normal. Advantageously, the electromagnetic radiation that is coupled out by each of the sections can mix and overlap, which results in a particularly good colour homogeneity.

According to at least one embodiment, the sections each are curved and end regions of each section span a plane, wherein the planes are tilted with respect to one another. The planes are thereby further virtual planes extending along the virtual plane analogous to the sections which are flat and are tilted to the virtual plane and with respect to one another. Between the end regions of each section the sections can have a convex or concave shape. Furthermore, the sections can have a spherical, aspherical or free form. Preferably, the curved sections have the same shape.

Due to the curved sections, the electromagnetic radiation that is coupled out can already be bundled or expanded by the respective section. This has the advantage that the colour homogeneity can be further improved.

According to at least one embodiment, an angle between two adjacent tilted sections is at most 20°.

According to at least one embodiment, a side surface of the radiation-emitting semiconductor chip is surrounded by a second reflector layer. The second reflector layer is preferably in direct and immediate contact with the side surface of the carrier. In addition, a top surface of the second reflector layer, which is opposite a bottom surface, can be flush with the top surface of the semiconductor chip. Furthermore, the bottom surface of the second reflector layer can be in direct and immediate contact with the top surface of the carrier.

The second reflector layer is preferably formed by a plastic or silicone filled with radiation scattering and/or radiation reflecting particles. The particles of the second reflector layer are, for example, titanium oxide particles.

Alternatively, it is possible that the second reflector layer is only partially reflective and a small proportion, for example, at most 15%, of the primary electromagnetic radiation emitted by the semiconductor chip passes through the second reflector layer.

The first reflector layer and the second reflector layer, for example, are configured to reflect a part of the primary electromagnetic radiation. The first and second reflector layers preferably have a reflectivity of at least 90% for primary electromagnetic radiation generated in the active region.

According to at least one embodiment, a side surface of the first reflector layer is inclined to the top surface of the carrier. Preferably, the side surface of the first reflector layer has the same slope as the side surface of the cover body. Furthermore, the side surface of the first reflector layer can be a section and thus be part of the sections.

According to at least one embodiment, the cover body contains phosphor particles that partially convert primary electromagnetic radiation into secondary electromagnetic radiation. In this case, the cover body is configured to convert part of the primary electromagnetic radiation into secondary electromagnetic radiation. This means, for example, that the cover body converts the primary electromagnetic radiation generated by the semiconductor chip during operation into secondary electromagnetic radiation. The cover body preferably comprises a matrix material in which phosphor particles are incorporated. The matrix material can be a resin, such as epoxy or silicone, or a mixture of these materials, or a ceramic material. The phosphor particles give the cover body its wavelength converting properties.

For example, one of the following materials is suitable for the phosphor particles: rare earth doped garnets, rare earth doped alkaline earth sulphides, rare earth doped thiogallates, rare earth doped aluminates, rare earth doped silicates, rare earth doped orthosilicates, Rare earth doped chlorosilicates, rare earth doped alkaline earth silicon nitrides, rare earth doped oxynitrides, rare earth doped aluminium oxynitrides, rare earth doped silicon nitrides, rare earth doped sialons, quantum dots. These materials can also be used without matrix material. The conversion layer can then consist of one of the materials.

If, for example, the radiation-emitting semiconductor chip is a volume-emitting semiconductor chip, the primary electromagnetic radiation emitted during operation, which emerges from the side surface of the semiconductor body, is reflected back and can, for example, be reflected in the direction of the cover body. This means that the primary electromagnetic radiation reflected from the side surface of the semiconductor body towards the top surface of the semiconductor body and entering the cover body from the top surface of the semiconductor body is preferably partially converted to secondary radiation. By means of the first reflector layer, the electromagnetic primary and secondary radiation is reflected again, so that the primary radiation enters the cover body again and can preferably be partially converted again.

The primary radiation and secondary radiation reflected by the first reflector layer can, for example, be reflected again by the bottom surface of the second reflector layer. This means that the primary radiation and the secondary radiation are directed by means of the first and the second reflector layer, for example in the direction of the inclined side surface of the cover body.

A method for producing a radiation-emitting component is also specified. The method is preferably suitable for the production of a radiation-emitting component described here. This means that a radiation-emitting component described here can be produced by the process described or is produced by the process described. All features disclosed in connection with the radiation-emitting component are therefore also disclosed in connection with the method and vice versa.

According to at least one embodiment, the method comprises the step of providing a carrier. Alternatively, the carrier can be available in the form of a wafer, for example. This means that the wafer comprises a plurality of carriers in a compound. The wafer or the plurality of carriers can be separated into individual carriers in a later method step.

According to at least one embodiment, the method comprises the step of applying a radiation-emitting semiconductor chip on the carrier. The carrier preferably comprises at least two contact areas, which for example contain or consist of a metal. In addition, the semiconductor chip comprises at least two chip contact areas, for example containing or consisting of a metal. The chip contact areas can be applied to one contact area each, for example by gluing, bonding or soldering. This connection attaches the semiconductor chip to the carrier.

It is also possible that a plurality of radiation-emitting semiconductor chips are applied to the carrier in the form of a wafer.

According to at least one embodiment, the method comprises the step of applying a cover body over the radiation-emitting semiconductor chip. Here, the material of the cover body is present during application, for example, in a flowable form. In this case, the material of the cover body is cured after the application of the cover body. Furthermore, the material of the cover body can be applied by spraying, screen printing or squeegee.

In the case of the wafer form of the carrier, the cover body is applied completely over the plurality of radiation-emitting semiconductor chips.

According to at least one embodiment, the method comprises the step of applying a first reflector layer on the cover body. Here, the material of the first reflector layer is available in a flowable form, for example. In this case, the material of the first reflector layer is cured after the application on the first reflector layer. Furthermore, the material of the first reflector layer can be applied by spraying, screen printing or squeegee.

In the case of the wafer form of the carrier, the first reflector layer is applied completely over the cover body.

According to at least one embodiment, the method comprises the step of producing a slope on a side surface of the cover body. The slope is preferably created by removing material from the cover body on its side surface.

In the case of the wafer form of the carrier, in addition to the material removal of the cover body, the remaining components can be cut through in the vertical direction, thus separating the assembly into individual radiation-emitting components.

In accordance with at least one embodiment, the slope is also generated on a side surface of the first reflector layer when the slope is generated.

According to at least one embodiment, the slope is generated by a sawing process. Preferably, the side surface of the cover body or the side surface of the cover body and the side surface of the first reflector layer, which are flat, are generated by means of a saw blade. A shape of the saw blade is formed according to the inclined side surfaces.

According to at least one embodiment, the slope is generated by a laser process. Preferably the side surface of the cover body or the side surface of the cover body and the side surface of the first reflector layer, which are curved, are produced by a laser.

According to at least one embodiment, the slope is generated by a casting process. Preferably, the side surface of the cover body or the side surface of the cover body and the side surface of the first reflector layer, which are curved or flat, are produced by a casting process.

According to at least one embodiment, a first reflector layer is applied over the carrier before the application of the cover body, which embeds the radiation-emitting semiconductor chip. The second reflector layer preferably covers the side surface of the semiconductor chip, while the top surface of the semiconductor chip is free of the second reflector layer.

A material of the second reflector layer is available in a flowable form, for example. In this case, the material of the second reflector layer is cured after application to the second reflector layer. Furthermore, the material of the second reflector layer can be applied by spraying, screen printing or squeegee.

In the following, the radiation-emitting component described here and the method described here are explained in more detail using exemplary embodiments and the associated figures.

Figure 2:
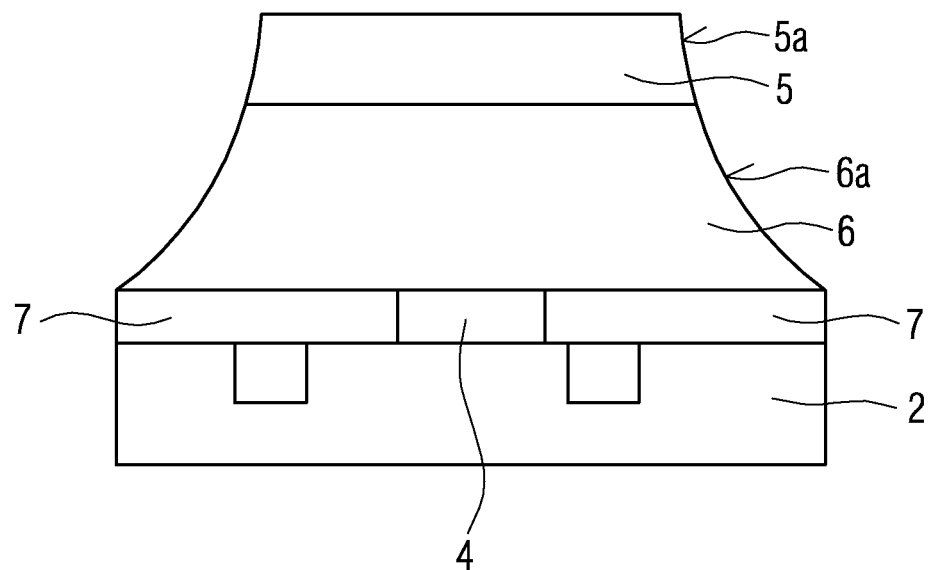
Figure 3:
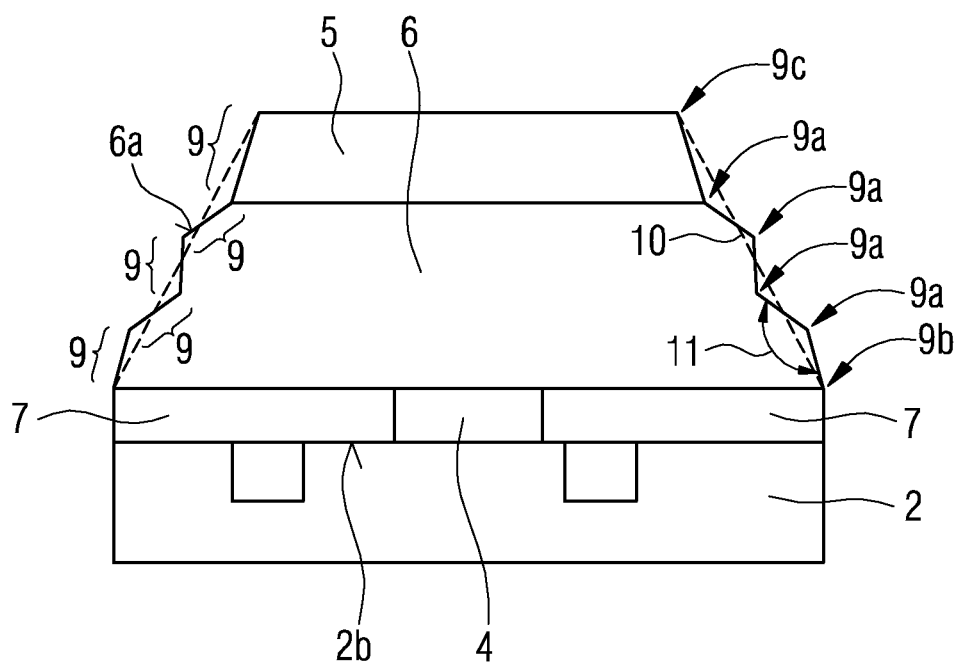

They show:

FIG. 1 schematic sectional views of a method step of an exemplary embodiment of a method described here for the production of a radiation-emitting component, FIG. 2 schematic sectional views of an exemplary embodiment of a radiation-emitting component described here, FIG. 3 schematic sectional views of an exemplary embodiments of a radiation-emitting component described here.

Identical, similar or similarly acting elements are marked with the same reference signs in the figures. The figures and the proportions of the elements shown in the figures to one another are not to be regarded as true to scale. Rather, individual elements can be oversized for better representability and/or comprehensibility.

In connection with FIG. 1, an exemplary embodiment of a method step of a production process for a radiation-emitting component 1 described here is shown.

The radiation-emitting component 1 comprises a carrier 2, on the top surface of which, a radiation-emitting semiconductor chip 4 is arranged. The carrier 2 has two contact areas 3 on its top surface which are introduced into the top surface of the carrier 2b. The contact areas 3 only partially penetrate the carrier 2.

A side surface of the semiconductor chip 4a is completely covered with a second reflector layer 7. A cover body 6 is arranged above the second reflector layer 7 and the radiation-emitting semiconductor chip 4. The second reflector layer 5 is arranged on the cover body 6. For example, the arrangement is in a wafer composite. This means that semiconductor chips 4 are placed at a distance from one another on the carrier 2, which is provided in the form of a wafer, and the elements arranged above it are arranged over the entire surface of the carrier and the semiconductor chip.

In the case that the carrier 2 is provided in the form of a wafer, the arrangement is separated in the exemplary embodiment of the method step shown in FIG. 1 by means of the saw blades 8.

The saw blades 8 have a slope in the region of the cover body 6 and the first reflector layer 7. This shape is used to remove material from the side surface of the cover body 6a and the side surface of the first reflector layer 5a, so that they each have a slope. After the sawing step, the component 1 has the side surface of the cover body 6a which is inclined to the top surface of the carrier 2b. The top surface of the carrier 2b and the side surface of the cover body 6a facing the carrier 2 enclose an angle of less than 90°. Furthermore, a cross-sectional area of the cover body 6 tapers in lateral directions starting from the semiconductor chips towards the first reflector layer 5. The side surface of the cover body 6a and the side surface of the first reflector layer 7a are flat.

The radiation-emitting semiconductor chip has a substrate 12 on which a semiconductor body 13 is epitaxially grown or applied.

In contrast to the exemplary embodiment of the method step in connection with FIG. 1, an exemplary embodiment of a radiation-emitting component 1 is shown in connection with FIG. 2, in which the side surface of the cover body 6a and the side surface of the first reflector layer 7a are curved. The side surface of the cover body 6a and the side surface of the first reflector layer 7a have a concave shape.

In contrast to the exemplary embodiment in connection with FIG. 2, the exemplary embodiment in connection with FIG. 3 shows a side surface of the cover body 6a, a radiation-emitting component 1, in which the side surface of the cover body 6a has a plurality of sections 9. Here the side surface of the first reflector layer 5a is also a section 9, the sections 9 being formed by part of the side surface of the cover body 6a and by the side surface of the first reflector layer 5a. The sections 9 each have end regions 9a where the directly adjacent sections 9 are in direct contact. The end regions 9a of each section 9 are preferably at the same height in the vertical direction.

Here, the sections 9 each are flat and are tilted with respect to one another. The end region of a first section 9b, which is in the region of the semiconductor chip 4 in the vertical direction, and the end region of a last section 9c, which is in the region of the first reflector layer 5 in the vertical direction, can span a virtual plane 10 which is inclined to the top surface of the carrier 2b. The virtual plane 10 has the same properties as the inclined side surface of the cover body 6a described in FIG. 1. The sections 9 extend along the virtual plane 10 and are each tilted towards and with respect to the virtual plane 10. An angle 11 between two adjacent tilted sections is at most 20°.

The present application claims the priority of the German application DE 102018116327.4, whose disclosure content is hereby incorporated by reference.

The invention is not limited to the description based on the exemplary embodiments. Rather, the invention comprises any new feature as well as any combination of features, which includes in particular any combination of features in the claims, even if this feature or combination itself is not explicitly stated in the claims or exemplary embodiments.

LIST OF REFERENCE SIGNS 1 radiation-emitting component
2 carrier
2b top surface of carrier
3 contact areas
4 radiation-emitting semiconductor chip
4a side surface of semiconductor chip
5 first reflector layer
5a side surface first reflector layer
6 cover body
6a side surface of cover body 7 second reflector layer
8 saw blade
9 section
9a end region
9b end region first section
9c end region last section
10 virtual plane
11 angle

The invention claimed is:

1. A radiation-emitting component, comprising:
    a carrier having a top surface,
    a radiation-emitting semiconductor chip arranged on the top surface of the carrier and configured to generate primary electromagnetic radiation,
    a first reflector layer arranged above a top surface of the semiconductor chip, and
    a cover body arranged between the first reflector layer and the radiation-emitting semiconductor chip, wherein
    the cover body is formed of a resin,
    a side surface of the cover body is inclined to the top surface of the carrier,
    the side surface of the cover body has traces of a sawing process or a laser process,
    a cross-sectional area of the cover body tapers in lateral directions starting from the semiconductor chip to the first reflector layer;
    a side surface of the first reflector layer is inclined to the top surface of the carrier; and
    the side surface of the first reflector layer has the traces of the sawing process or the laser process.

2. The radiation-emitting component according to claim 1,
    in which the side surface of the cover body is flat.

3. The radiation-emitting component according to claim 1,
    in which a side surface of the radiation-emitting semiconductor chip is surrounded by a second reflector layer.

4. The radiation-emitting component according to claim 1,
    in which the cover body contains phosphor particles that partially convert primary electromagnetic radiation into secondary electromagnetic radiation.

5. The radiation-emitting component according to claim 1, which the top surface of the carrier and the side surface of the cover body facing the carrier have an angle of at most 60°.

6. A radiation-emitting component, comprising:
    a carrier having a top surface,
    a radiation-emitting semiconductor chip arranged on the top surface of the carrier and configured to generate primary electromagnetic radiation,
    a first reflector layer arranged above a top surface of the semiconductor chip, and
    a cover body arranged between the first reflector layer and the radiation-emitting semiconductor chip, wherein
    the radiation-emitting semiconductor chip has a substrate on which a semiconductor body is epitaxially grown or applied,
    the substrate is formed of sapphire,
    the cover body is formed of a resin,
    a side surface of the cover body is inclined to the top surface of the carrier,
    the side surface of the cover body has traces of a sawing or a laser process,
    a cross-sectional area of the cover body tapers in lateral directions starting from the semiconductor chip to the first reflector layer,
    the first reflector layer completely covers the top surface of the radiation-emitting semiconductor chip;
    a side surface of the first reflector layer is inclined to the top surface of the carrier, and
    the side surface of the first reflector layer has the traces of the sawing process or the laser process.

* * * * *